(12) United States Patent
Chen et al.

(10) Patent No.: US 10,388,756 B2
(45) Date of Patent: Aug. 20, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yen-Hsing Chen, Taipei (TW); Chun-Yu Chen, Taichung (TW); Chung-Ting Huang, Kaohsiung (TW); Zih-Hsuan Huang, Tainan (TW); Yu-Chien Sung, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 27 days.

(21) Appl. No.: 15/869,087

(22) Filed: Jan. 12, 2018

(65) Prior Publication Data

US 2019/0221655 A1 Jul. 18, 2019

(51) Int. Cl.
| | |
|---|---|
| H01L 29/66 | (2006.01) |
| H01L 21/3213 | (2006.01) |
| H01L 29/06 | (2006.01) |
| H01L 21/033 | (2006.01) |
| H01L 29/78 | (2006.01) |
| H01L 27/088 | (2006.01) |

(52) U.S. Cl.
CPC ...... *H01L 29/66636* (2013.01); *H01L 21/033* (2013.01); *H01L 21/32139* (2013.01); *H01L 27/0886* (2013.01); *H01L 29/0653* (2013.01); *H01L 29/6656* (2013.01); *H01L 29/66545* (2013.01); *H01L 29/66795* (2013.01); *H01L 29/66818* (2013.01); *H01L 29/7848* (2013.01)

(58) Field of Classification Search
CPC ......... H01L 29/66636; H01L 29/66818; H01L 29/66795; H01L 27/0886; H01L 29/7848; H01L 29/66545; H01L 29/0653
See application file for complete search history.

(56) References Cited

U.S. PATENT DOCUMENTS

| | | | |
|---|---|---|---|
| 9,293,373 B1* | 3/2016 | Cheng | H01L 21/823412 |
| 9,419,141 B2 | 8/2016 | Huang | |
| 9,601,514 B1* | 3/2017 | Cheng | H01L 27/1211 |
| 10,269,968 B2* | 4/2019 | Chen | H01L 29/7851 |
| 2007/0018236 A1* | 1/2007 | Tsuchiaki | H01L 29/0653 257/324 |
| 2015/0035046 A1* | 2/2015 | Kim | H01L 29/42392 257/327 |
| 2015/0206974 A1* | 7/2015 | Lim | H01L 29/7851 257/288 |
| 2015/0279975 A1* | 10/2015 | Hsiao | H01L 29/66818 257/401 |
| 2015/0303305 A1* | 10/2015 | Ching | H01L 29/7851 257/192 |
| 2016/0027902 A1* | 1/2016 | Yoon | H01L 21/30608 438/198 |

(Continued)

*Primary Examiner* — Bac H Au
(74) *Attorney, Agent, or Firm* — Winston Hsu

(57) ABSTRACT

A method for fabricating a semiconductor device is disclosed. A fin is formed on a substrate. The fin protrudes from a trench isolation layer on a substrate. The fin comprises a source region, a drain region and a channel region therebetween. A dummy gate strides across the fin and surrounding the channel region. An upper portion of the fin is removed so as to form a hollow channel underneath the dummy gate. A replacement channel layer is in-situ epitaxially grown in the hollow channel.

13 Claims, 9 Drawing Sheets

(56) References Cited

U.S. PATENT DOCUMENTS

2016/0308048 A1* 10/2016 Ching ................. H01L 29/7848
2016/0359043 A1* 12/2016 Chen .................. H01L 29/7851
2018/0226496 A1*  8/2018 Gardner ............ H01L 21/02381

* cited by examiner

SEMICONDUCTOR DEVICE AND METHOD FOR FABRICATING THE SAME

BACKGROUND OF THE INVENTION

1. Field of the Invention

The disclosure relates generally to the field of semiconductor technology, and more particularly, to a fin field effect transistor (FinFET) with a replacement SiGe channel and manufacturing method thereof.

2. Description of the Prior Art

Replacement channel techniques are known in the art. A replacement channels are employed when the transistor devices are formed on substrates formed of silicon or similar materials. A high mobility material is used to replace a channel region in the substrate, which enables faster device speed than the silicon or other original channel material.

Typically, the replacement SiGe channel techniques involve the steps of silicon recessing, SiGe gap-filling, SiGe CMP (chemical mechanical polishing), and fin recessing, which are complex and costly. There is still a need in this industry to provide an improved method of forming the replacement channels in the semiconductor substrate.

SUMMARY OF THE INVENTION

It is one object of the present invention to provide a fin field effect transistor (FinFET) and a method for making the same in order to solve the above-mentioned prior art shortcomings or problems.

In order to achieve the foregoing object, in one embodiment, the present invention provides a method for fabricating a semiconductor device. A fin is formed on a substrate. The fin protrudes from a trench isolation layer on a substrate. The fin comprises a source region, a drain region and a channel region therebetween. A dummy gate strides across the fin and surrounding the channel region. An upper portion of the fin is removed so as to form a hollow channel underneath the dummy gate. A replacement channel layer is in-situ epitaxially grown in the hollow channel.

According to one aspect of the invention, a semiconductor device is disclosed. The semiconductor structure includes a bulk semiconductor substrate; a fin on the bulk semiconductor substrate, the fin comprising a source region, a drain region and a channel region therebetween; a replacement channel layer disposed in the channel region; a gate striding across the fin and surrounding the replacement channel layer; an epitaxial source layer in the source region; and an epitaxial drain layer in the drain region. The epitaxial source layer and the epitaxial drain layer are contiguous with the replacement channel layer. A bottom surface of the epitaxial source layer and the epitaxial drain layer is shallower than a bottom surface of the replacement channel layer. The thickness of the replacement channel layer ranges between 400~600 angstroms. The thickness of the replacement channel layer is uniform between the source region and the drain region.

According to another aspect of the invention, a semiconductor device is disclosed. The semiconductor structure includes a bulk semiconductor substrate; a fin on the bulk semiconductor substrate, the fin comprising a source region, a drain region and a channel region therebetween; a replacement channel layer disposed in the channel region; a gate striding across the fin and surrounding the replacement channel layer; an epitaxial source layer in the source region; and an epitaxial drain layer in the drain region, wherein the epitaxial source layer and the epitaxial drain layer are contiguous with the replacement channel layer. The replacement channel layer has a tapered sectional profile between the source region and the drain region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more readily apparent to those ordinarily skilled in the art after reviewing the following detailed description and accompanying drawings, in which:

FIG. 1A, FIG. 1B, FIG. 2A, FIG. 2B, FIG. 3A, FIG. 3B, FIG. 4A, FIG. 4B, FIG. 4C, FIG. 5A, FIG. 5B, and FIG. 5C are schematic diagrams showing a method for fabricating a semiconductor device according to one embodiment of the invention, wherein FIG. 1A, FIG. 2A, FIG. 3A, FIG. 4A, and FIG. 5A are schematic perspective views of the semiconductor device in different manufacturing stages, FIG. 1B, FIG. 2B, FIG. 3B, FIG. 4B, and FIG. 5B are schematic, cross-sectional views taken along line I-I' in FIG. 1A, FIG. 2A, FIG. 3A, FIG. 4A, and FIG. 5A, respectively, and FIG. 4C and FIG. 5C are schematic, cross-sectional views taken along line I-I' in FIG. 4A and FIG. 5A, respectively, according to another embodiment.

DETAILED DESCRIPTION

Figure 1A:
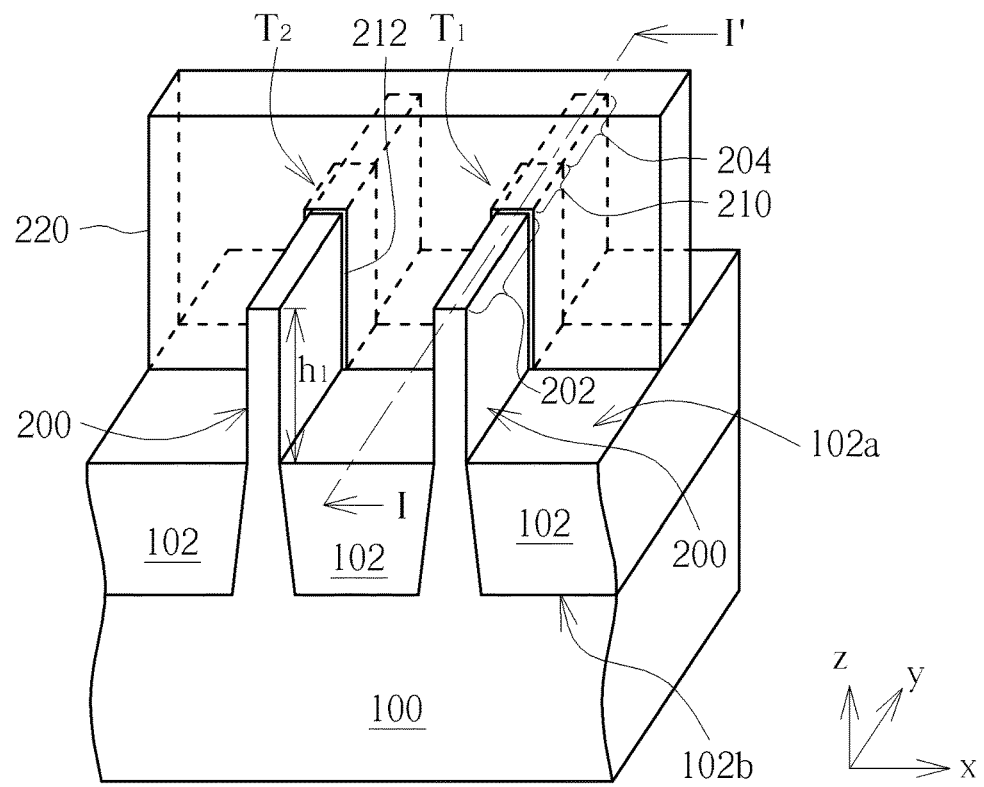

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1A to FIG. 5C. FIG. 1A to FIG. 5C are schematic diagrams showing a method for fabricating a semiconductor device according to one embodiment of the invention, wherein FIGS. 1A~5A are schematic perspective views of the semiconductor device in different manufacturing stages and FIGS. 1B~5B are schematic, cross-sectional views taken along line I-I' in FIGS. 1A~5A, respectively. According to one aspect of the invention, the semiconductor device is a FinFET transistor with a replacement channel layer.

Figure 1B:
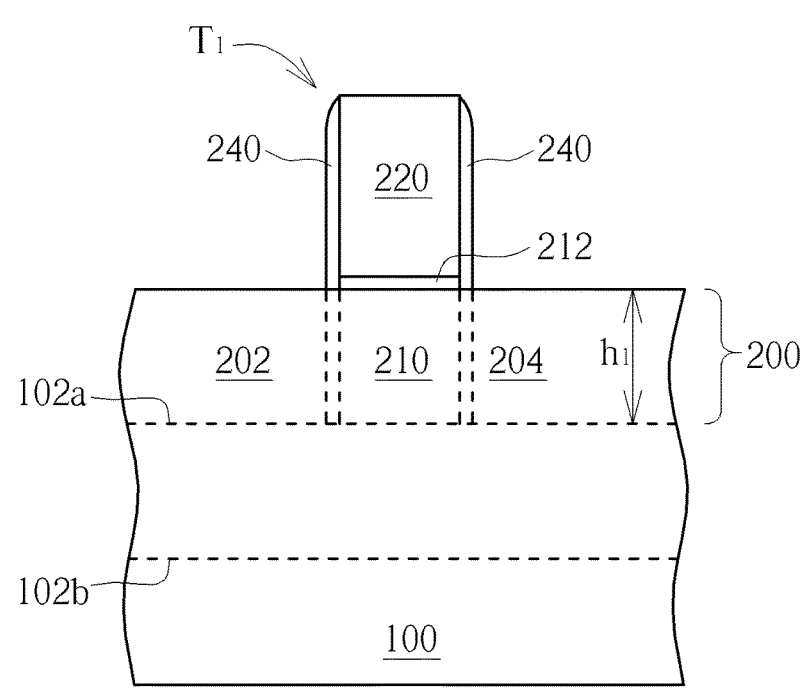

As shown in FIG. 1A and FIG. 1B, two exemplary FinFET transistors $T_1$ and $T_2$ are fabricated on a bulk semiconductor substrate 100 such as a single crystalline silicon substrate. The two FinFET transistors $T_1$ and $T_2$ are isolated from each other by a trench isolation layer such as a shallow trench isolation (STI) region 102. Two fins 200, which protrude from a top surface 102a of the STI region 102, extend along a first direction (i.e., the reference y-axis). At this point, the fins 200 have a height $h_1$ above the top surface 102a of the STI region 102.

A dummy gate 220 strides across the two fins 200 and extends along a second direction (i.e., the reference x-axis). According to one embodiment, the dummy gate 220 may comprise polysilicon, but is not limited thereto. According to another embodiment, the dummy gate 220 may comprise a polysilicon layer and a hard mask layer on the polysilicon layer. A gate dielectric layer 212 may be disposed between the dummy gate 220 and each of the fins 200. A sidewall spacer 240 may be disposed on each sidewall of the dummy gate 220. According to one embodiment, the sidewall spacer 240 and the hard mask layer (not shown) on the dummy gate 220 may comprise similar dielectric material such as silicon nitride or silicon carbon nitride. Silicon nitride has sufficient etching selectivity to silicon, so as to protect the polysilicon dummy gate from being etched during subsequent silicon recess process.

On two opposite sides of the dummy gate 220, a source region 202 and a drain region 204 are provided, respectively. A channel region 210 is disposed between the source region 202 and the drain region 204 directly under the dummy gate 220 in each of the fins 200.

Figure 2A:
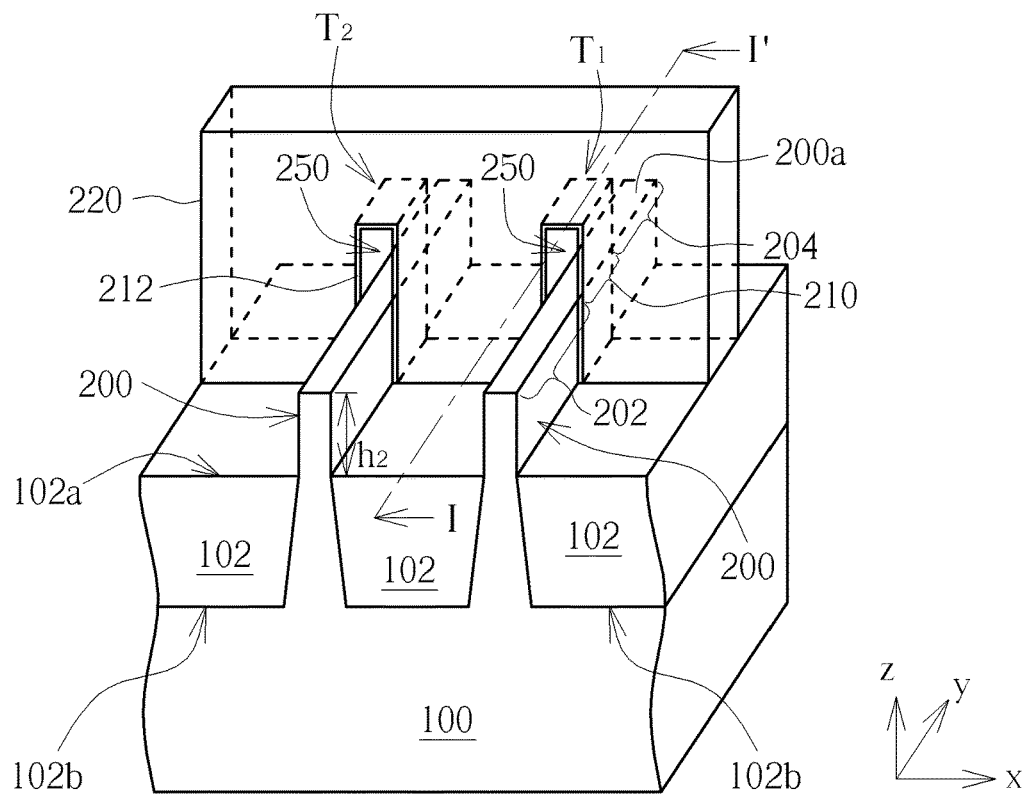
Figure 2B:
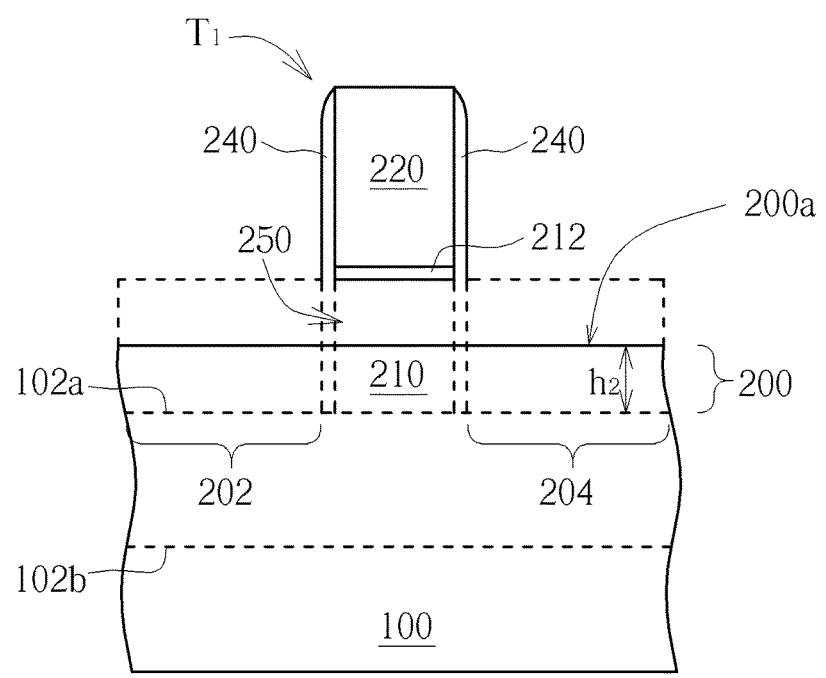

As shown in FIG. 2A and FIG. 2B, after forming the dummy gate 220, the bulk semiconductor substrate 100 is placed in an epitaxial growth chamber. Subsequently, an etching process is performed in the epitaxial growth chamber to remove an upper portion of each of the fins 200, thereby forming a hollow channel 250 underneath the dummy gate 220.

According to one embodiment, as can be seen in FIG. 2B, the hollow channel 250 is located between the dummy gate 220 and a flat top surface 200a of the fin 200. According to one embodiment, the flat top surface 200a of the fin 200 is a (001) crystallographic plane of the single crystalline silicon substrate. At this point, the fins 200 have a height $h_2$ above the top surface 102a of the STI region 102 ($h_2<h_1$). According to one embodiment, the difference between $h_2$ and $h_1$ may range between 400~600 angstroms.

According to one embodiment, the etching process may be performed with a gas chemistry comprising a chlorine-contain gas flowing at about 50 sccm to about 300 sccm and $GeH_4$ flowing at about 20 sccm to about 50 sccm. According to one embodiment, $GeH_4$ may act as a catalyst during the etching process. According to one embodiment, the etching process may be performed at temperature of about 600~700° C. and a pressure of about 50~200 torr in the epitaxial growth chamber, for a time period of about 20~300 seconds. Further, a carrier gas such $H_2$ may flow into the epitaxial growth chamber during the etching process. According to one embodiment, the chlorine-contain gas may comprise HCl or $Cl_2$, but is not limited thereto.

Figure 6:
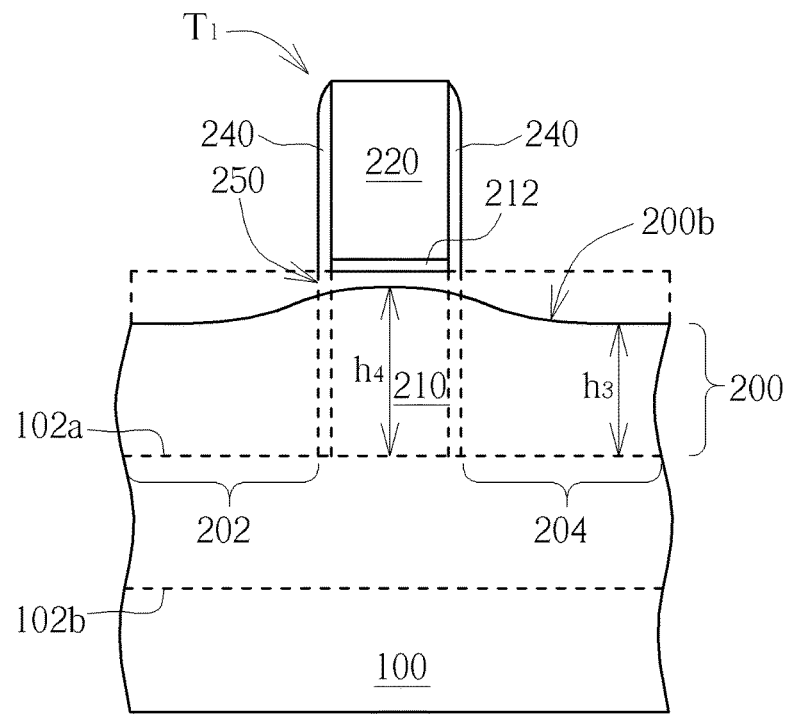
FIG. 6 to FIG. 9 are schematic, cross-sectional diagrams showing a method for fabricating a semiconductor device according to another embodiment of the invention.

According to another embodiment, as can be seen in FIG. 6, the etching process may be ceased before reaching the top surface 200a such that the fin 200 may have a curved and upwardly convex top surface 200b. In this case, the hollow channel 250 has a tapered sectional profile between the source region 202 and the drain region 204. According to another embodiment, the fins 200 may have a height $h_3$ at the source region 202 and the drain region 204 above the top surface 102a of the STI region 102 and may have a height $h_4$ approximately at the center of the hollow channel 250, wherein $h_2<h_3<h_4<h_1$.

Figure 3A:
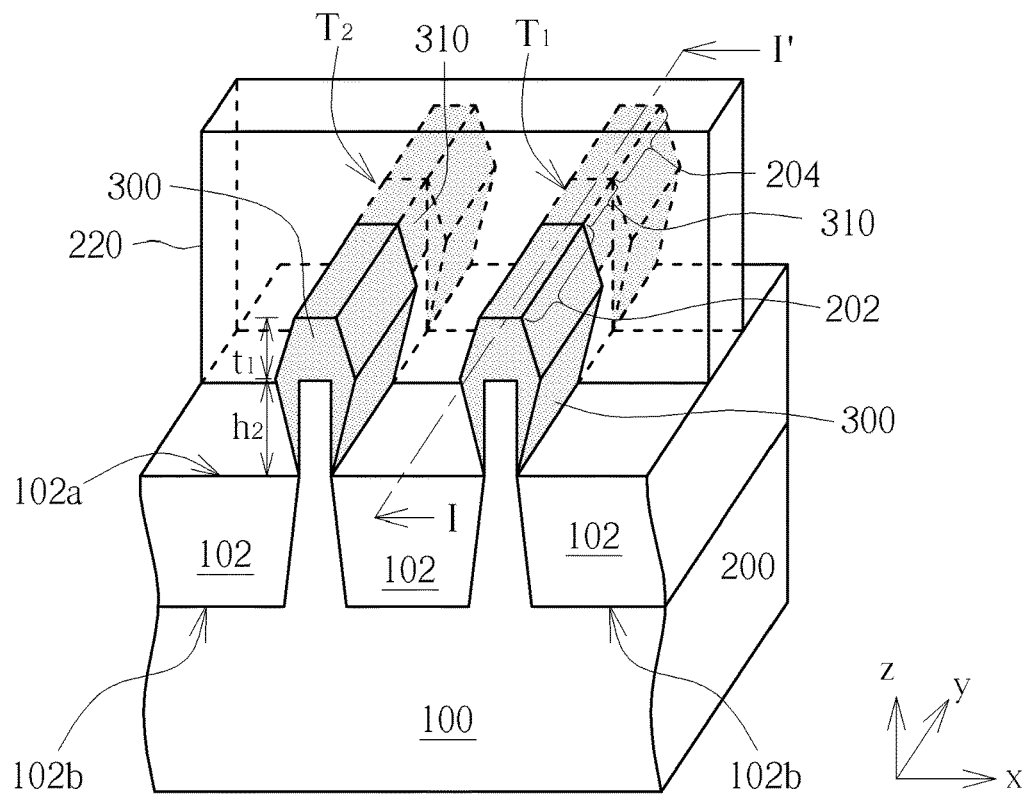
Figure 3B:
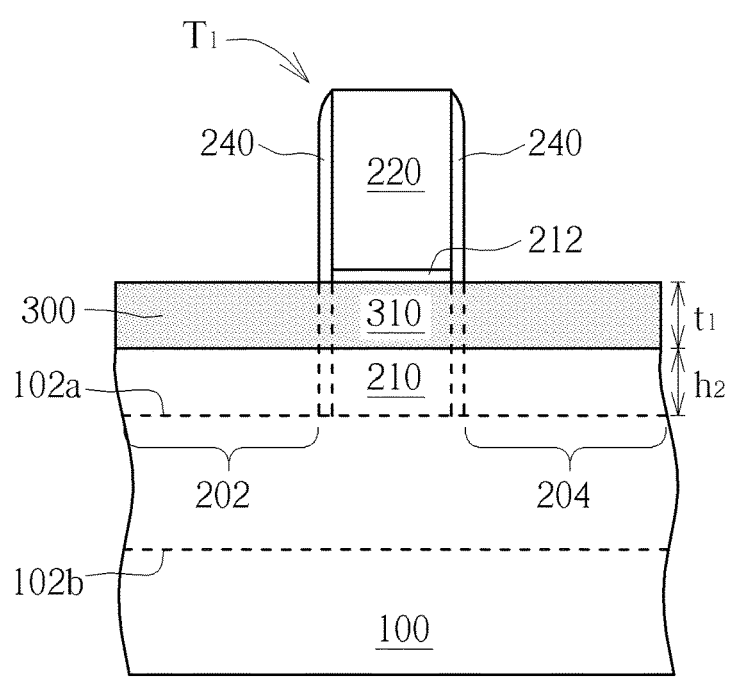

As shown in FIG. 3A and FIG. 3B, after forming the hollow channel 250, a replacement channel layer 300 is in-situ epitaxially grown on the each of the fins 200. According to one embodiment, the hollow channel 250 is completely filled with the replacement channel layer 300, thereby forming a replacement channel 310. According to one embodiment, the step of removing the upper portion of the fin 200 and the step of in-situ epitaxially growing replacement channel layer 300 in the hollow channel 250 take place in the same epitaxial growth chamber.

According to one embodiment, the replacement channel layer 300 may be grown onto a sidewall of the fin 200. It is understood that the profile of the replacement channel layer 300 is for illustration purposes only, depending upon the techniques and materials used, the replacement channel layer 300 may have various shapes or profiles on the fin 200.

According to one embodiment, the replacement channel layer 300 comprises a SiGe layer. According to one embodiment, the SiGe layer is an un-doped SiGe layer. According to one embodiment, a thickness $t_1$ of the replacement channel layer 300 may range between 400~600 angstroms. According to one embodiment, the thickness $t_1$ of the replacement channel layer 300 is uniform between the source region 202 and the drain region 204. According to one embodiment, the gate dielectric layer 212 is in direct contact with the replacement channel layer 300.

According to one embodiment, the aforesaid in-situ epitaxially growing process may be performed with a gas chemistry comprising $SiH_2Cl_2$ flowing at about 10 sccm to about 100 sccm, $GeH_4$ flowing at about 50 sccm to about 700 sccm, and a chlorine-contain gas flowing at about 50 sccm to about 300 sccm. According to one embodiment, the aforesaid in-situ epitaxially growing process may be performed at temperature of about 600~700° C. and a pressure of about 20~80 torr, for a time period of about 200~2000 seconds. According to one embodiment, the chlorine-contain gas comprises HCl.

Figure 7:
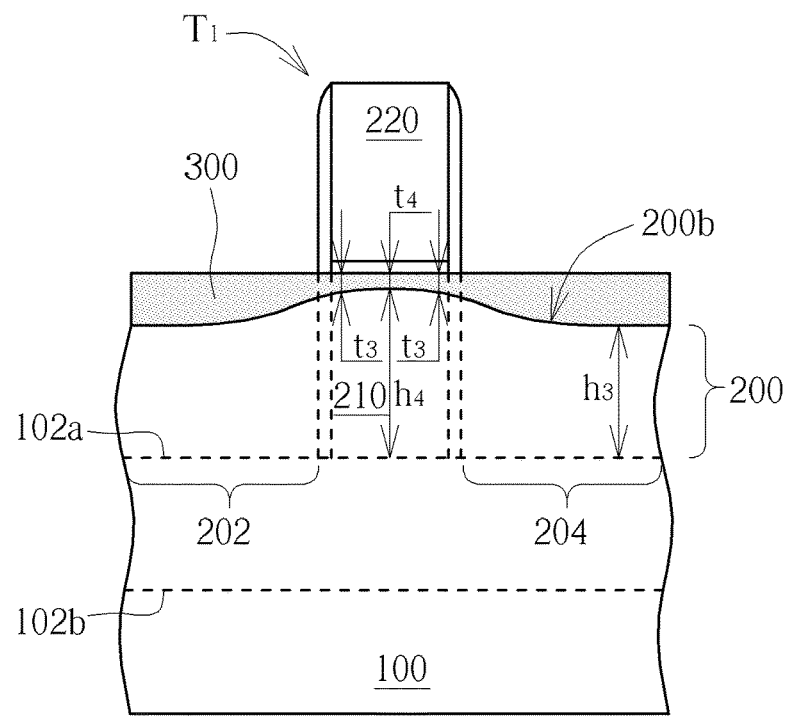

Please refer to FIG. 7, in a case that the fin 200 has a curved and upwardly convex top surface 200b as set forth in FIG. 6, the replacement channel layer 300 may have a tapered sectional profile between the source region 202 and the drain region 204. The upwardly convex top surface 200b of the fin 200 is in direct contact with a bottom surface of the replacement channel layer 300. The replacement channel layer 300 has a thickness $t_2$ at a central region of the channel region 210, and a thickness $t_3$ near the source region 202 or the drain region 204, wherein $t_3>t_2$.

Figure 4A:
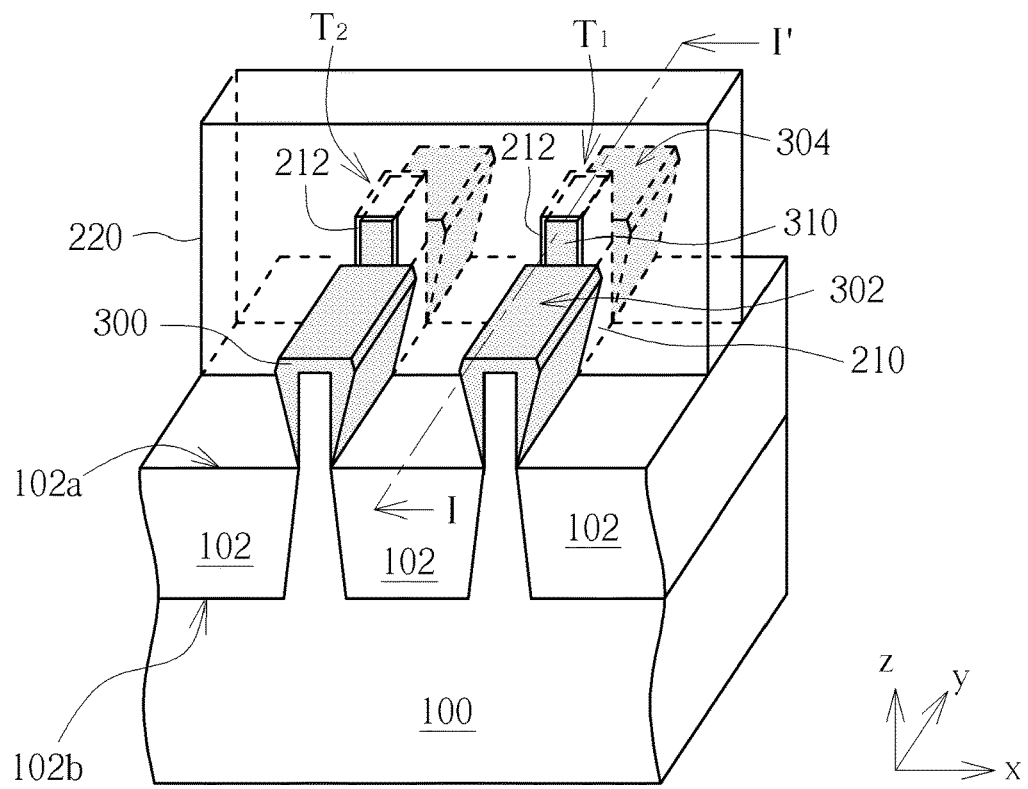
Figure 4B:
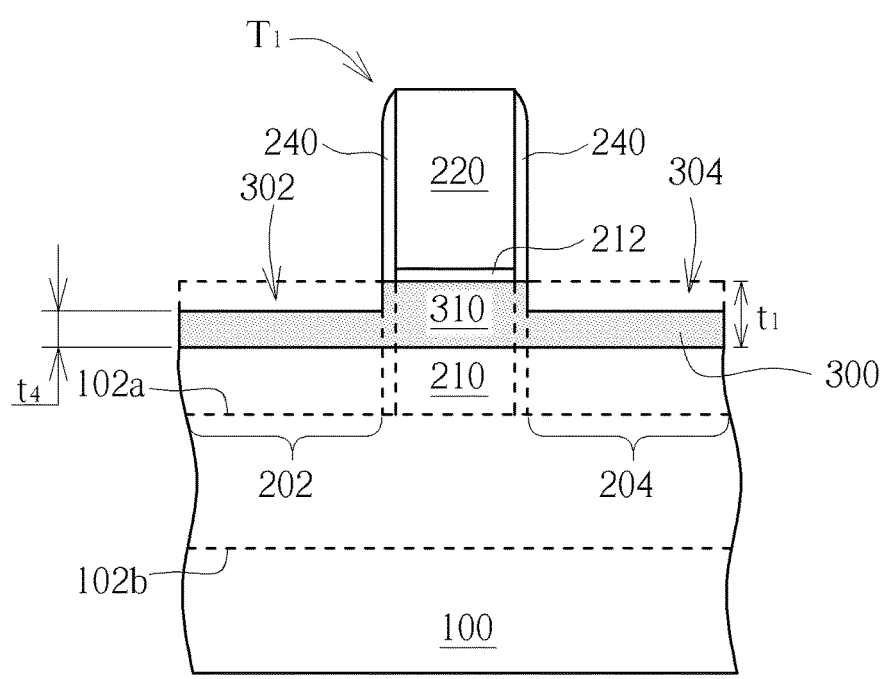

As shown in FIG. 4A and FIG. 4B, subsequently, the replacement channel layer 300 in the source region 202 and the drain region 204 is recessed. The replacement channel layer 300 in the source region 202 and the drain region 204 may be anisotropically etched such that the replacement channel layer 300 in the replacement channel 310 is substantially intact. After the anisotropically etching process, recessed regions 302 and 304 are formed within the source region 202 and the drain region 204, respectively.

Figure 4C:
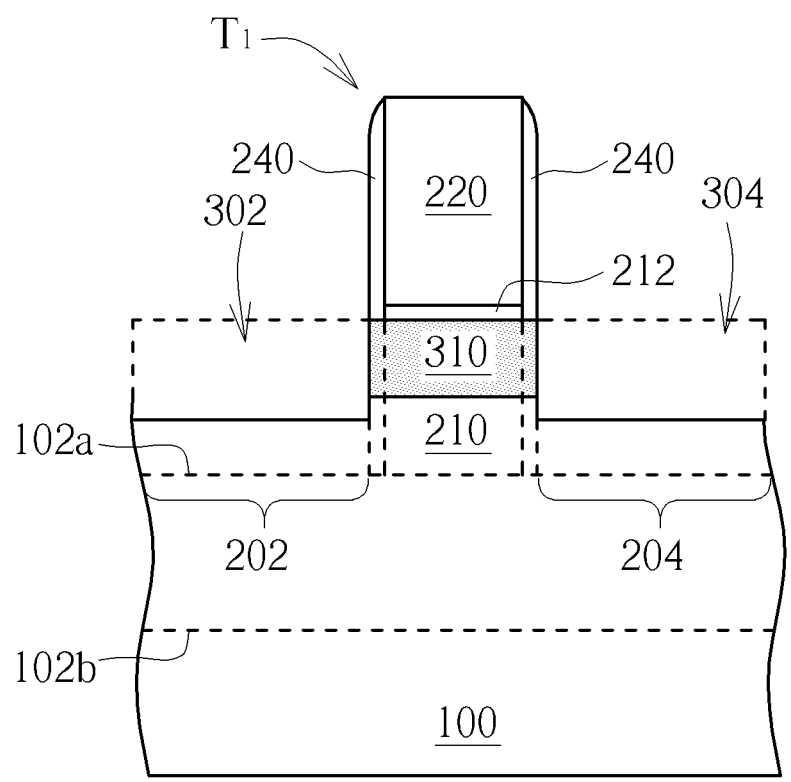

According to one embodiment, the depth of the recessed regions 302 and 304 is shallower than the originally deposited thickness $t_1$ of the replacement channel layer 300. In other words, the replacement channel layer 300 in the source region 202 and the drain region 204 is not completely removed. The remaining replacement channel layer 300 in the source region 202 and the drain region 204 has a thickness t4, wherein $t_4>0$. According to another embodiment, as shown in FIG. 4C, the depth of the recessed regions 302 and 304 may be deeper than the originally deposited thickness t₁ of the replacement channel layer 300.

Figure 8:
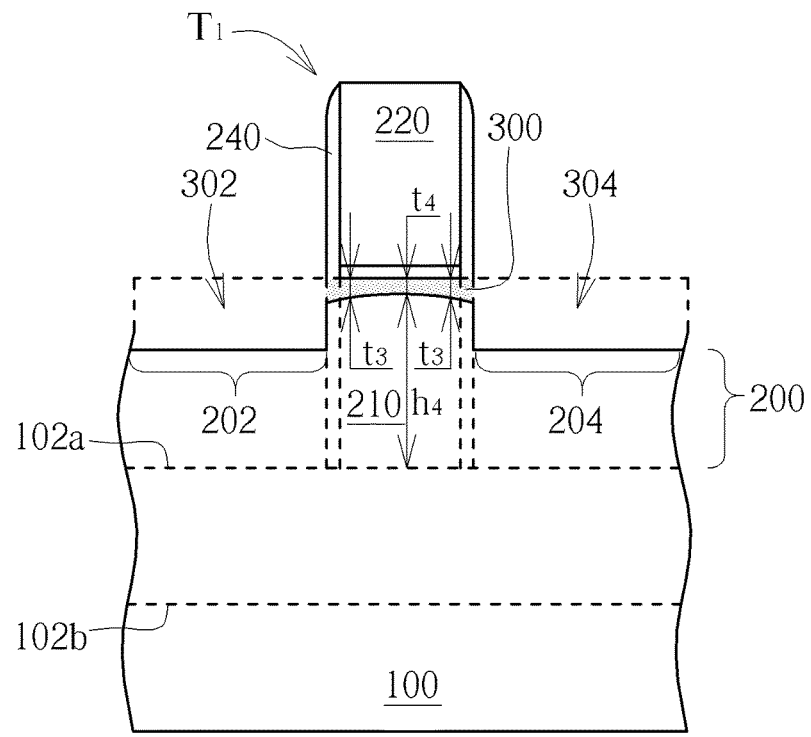

Please refer to FIG. 8, in a case that the fin 200 has a curved and upwardly convex top surface 200b as set forth in FIG. 7, the depth of the recessed regions 302 and 304 may be deeper than the originally deposited thickness of the replacement channel layer 300. In this case, the replacement channel layer 300 in the source region 202 and the drain region 204 may be completely removed.

Figure 5A:
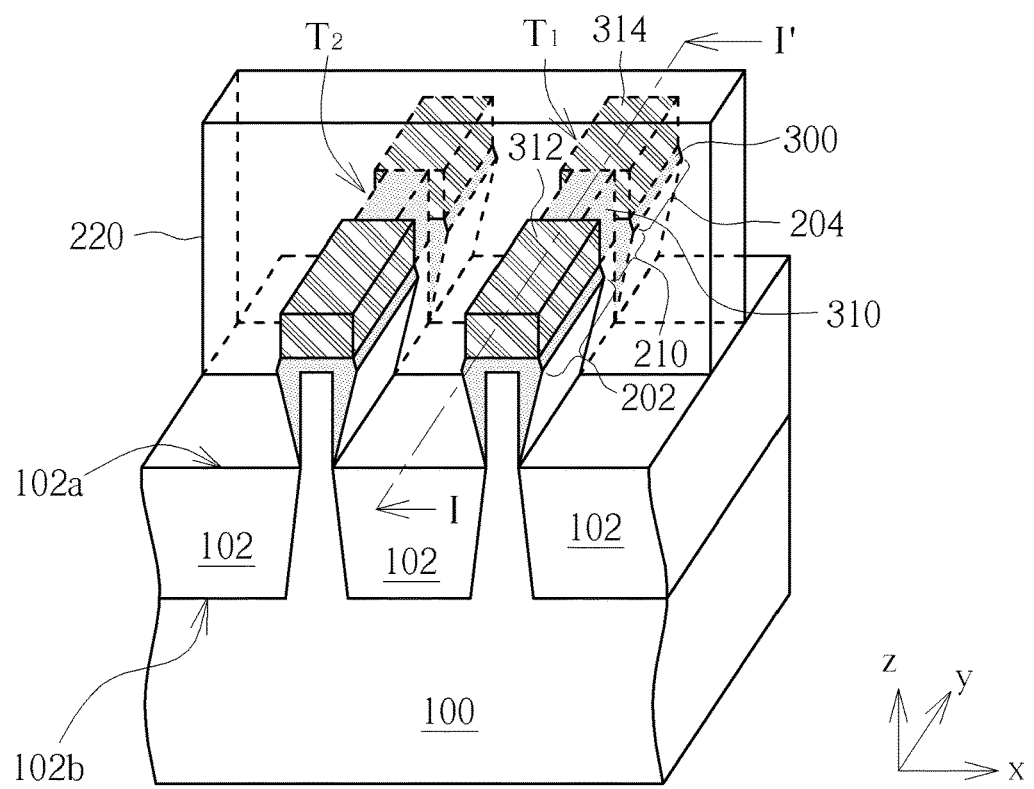
Figure 5B:
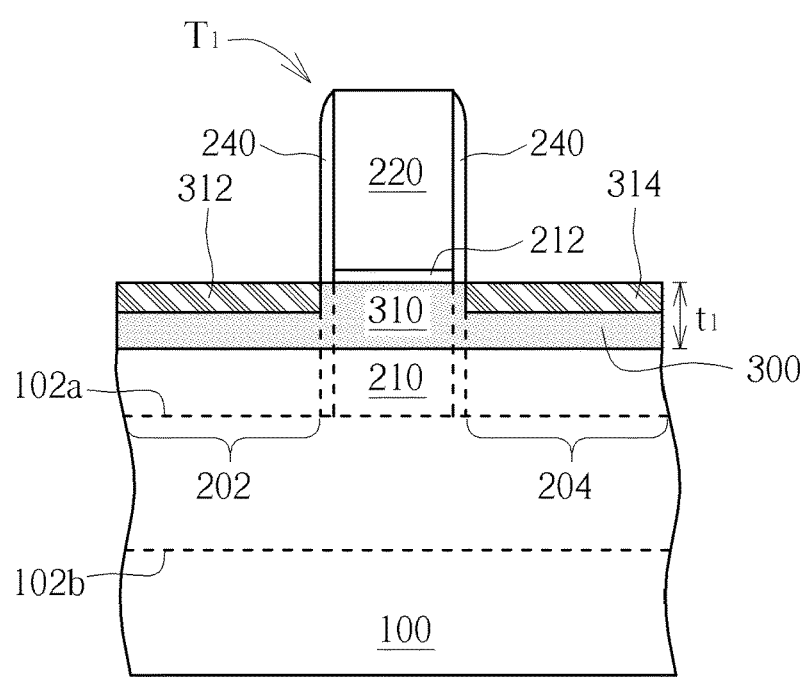

As shown in FIG. 5A and FIG. 5B, after forming the recessed regions 302 and 304 in the source region 202 and the drain region 204, respectively, an epitaxial growth process is performed to form an epitaxial source layer 312 in the source region 202 and an epitaxial drain layer 314 in the drain region 204. According to one embodiment, the epitaxial source layer 312 and the epitaxial drain layer 314 are contiguous with the replacement channel layer 300 in the replacement channel 310. According to one embodiment, a bottom surface of the epitaxial source layer 312 and the epitaxial drain layer 314 is shallower than a bottom surface of the replacement channel layer 300. According to one embodiment, the FinFET transistors $T_1$ and $T_2$ a PMOS finFET devices, and the epitaxial source layer 312 and the epitaxial drain layer 314 are boron-doped SiGe epitaxial layers.

Figure 5C:
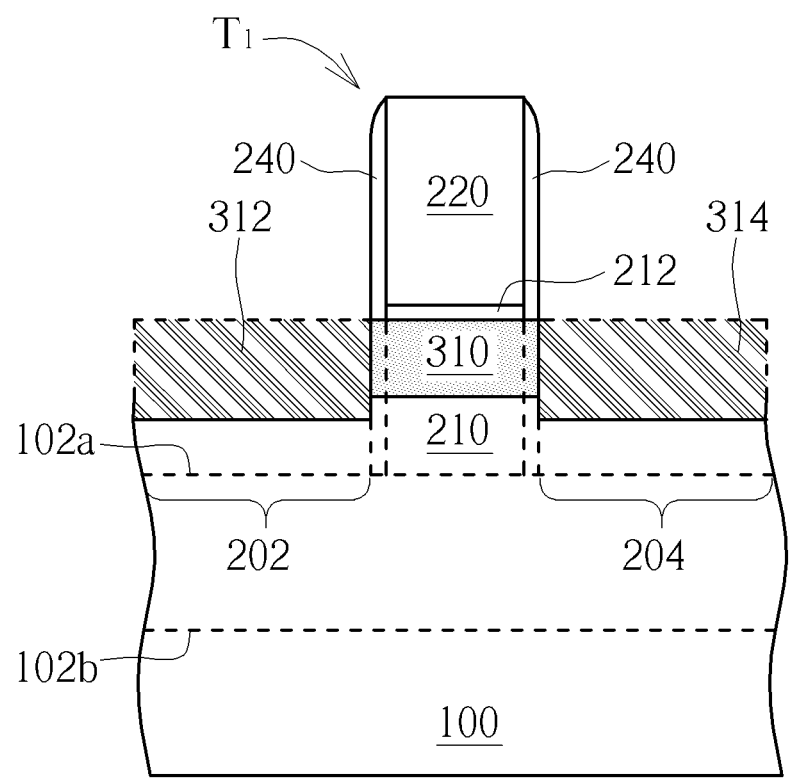

According to another embodiment, the depth of the recessed regions 302 and 304 is deeper than the originally deposited thickness $t_1$ of the replacement channel layer 300. As shown in FIG. 5C, after forming the recessed regions 302 and 304 in the source region 202 and the drain region 204, respectively, an epitaxial growth process is performed to form an epitaxial source layer 312 in the source region 202 and an epitaxial drain layer 314 in the drain region 204.

Subsequently, a replacement metal gate (RMG) process may be performed to replace the dummy gate 220 with a metal gate. Since the RMG process is known in the art, the details of the RMG process are omitted. For example, after the epitaxial source layer 312 and the epitaxial drain layer 314 are formed, an inter-layer dielectric (ILD) layer may be deposited in a blanket manner to cover the dummy gate 220. The ILD layer may be subjected to a chemical mechanical polishing (CMP) process and the top surface of the dummy gate 220 is exposed. Then, the dummy gate 220 is replaced with a metal gate.

Figure 9:
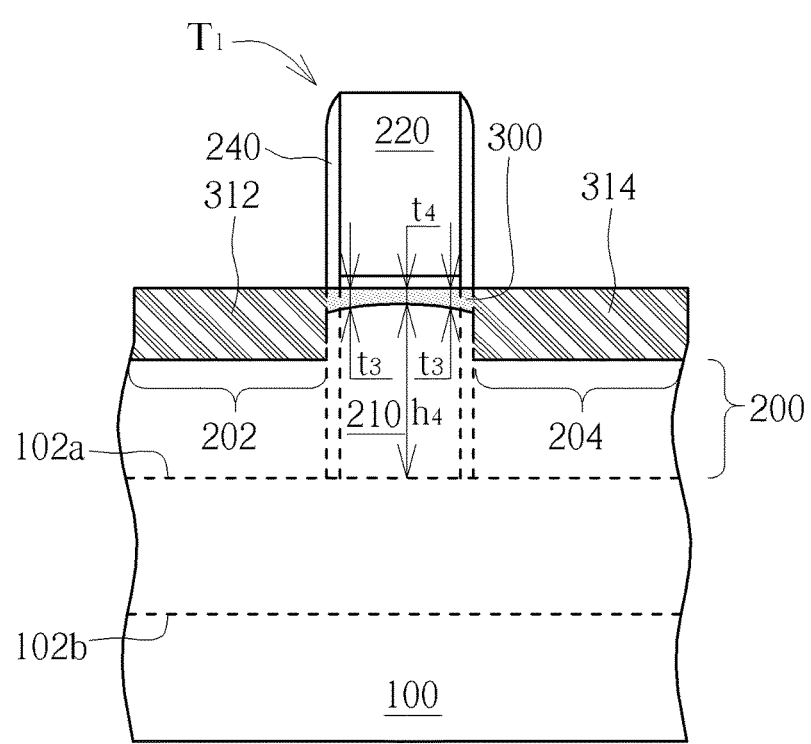

Please refer to FIG. 9, in a case that the fin 200 has a curved and upwardly convex top surface 200b as set forth in FIG. 8, likewise, after forming the recessed regions 302 and 304 in the source region 202 and the drain region 204, respectively, an epitaxial growth process is performed to form an epitaxial source layer 312 in the source region 202 and an epitaxial drain layer 314 in the drain region 204. According to one embodiment, the epitaxial source layer 312 and the epitaxial drain layer 314 are contiguous with the replacement channel layer 300 in the replacement channel 310. According to one embodiment, the FinFET transistors $T_1$ and $T_2$ a PMOS finFET devices, and the epitaxial source layer 312 and the epitaxial drain layer 314 are boron-doped SiGe epitaxial layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a bulk semiconductor substrate;
   a fin on the bulk semiconductor substrate, the fin comprising a source region, a drain region and a channel region therebetween;
   a replacement channel layer disposed in the channel region;
   a gate striding across the fin and surrounding the replacement channel layer;
   an epitaxial source layer in the source region; and
   an epitaxial drain layer in the drain region, wherein the epitaxial source layer and the epitaxial drain layer are contiguous with the replacement channel layer, and wherein a bottom surface of the epitaxial source layer and the epitaxial drain layer is shallower than a bottom surface of the replacement channel layer.

2. The semiconductor device according to claim 1, wherein the replacement channel layer comprises a SiGe layer.

3. The semiconductor device according to claim 2, wherein the SiGe layer is an un-doped SiGe layer.

4. The semiconductor device according to claim 1, wherein the thickness of the replacement channel layer ranges between 400~600 angstroms.

5. The semiconductor device according to claim 4, wherein the thickness of the replacement channel layer is uniform between the source region and the drain region.

6. The semiconductor device according to claim 1, wherein the semiconductor device is a PMOS finFET device, and wherein the epitaxial source layer and the epitaxial drain layer are boron-doped SiGe epitaxial layers.

7. The semiconductor device according to claim 1 further comprising a gate dielectric layer between the gate and the replacement channel layer, and wherein the gate dielectric layer is in direct contact with the replacement channel layer.

8. A semiconductor device, comprising:
   a bulk semiconductor substrate;
   a fin on the bulk semiconductor substrate, the fin comprising a source region, a drain region and a channel region therebetween;
   a replacement channel layer disposed in the channel region, wherein the replacement channel layer has a tapered sectional profile between the source region and the drain region;
   a gate striding across the fin and surrounding the replacement channel layer;
   an epitaxial source layer in the source region; and
   an epitaxial drain layer in the drain region.

9. The semiconductor device according to claim 8, wherein the fin comprises an upwardly convex surface that is in direct contact with a bottom surface of the replacement channel layer.

10. The semiconductor device according to claim 8, wherein the replacement channel layer comprises a SiGe layer.

11. The semiconductor device according to claim 10, wherein the SiGe layer is an un-doped SiGe layer.

12. The semiconductor device according to claim 8, wherein the semiconductor device is a PMOS finFET device, and wherein the epitaxial source layer and the epitaxial drain layer are boron-doped SiGe epitaxial layers.

13. The semiconductor device according to claim 8 further comprising a gate dielectric layer between the gate and the replacement channel layer, and wherein the gate dielectric layer is in direct contact with the replacement channel layer.

* * * * *